(12) United States Patent
Yang et al.

(10) Patent No.: US 7,933,753 B2
(45) Date of Patent: Apr. 26, 2011

(54) MODELING CIRCUIT OF A FIELD-EFFECT TRANSISTOR REFLECTING ELECTROSTATIC-DISCHARGE CHARACTERISTIC

(75) Inventors: Gi-Young Yang, Suwon-si (KR); Se-Young Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 795 days.

(21) Appl. No.: 11/982,533

(22) Filed: Nov. 2, 2007

(65) Prior Publication Data
US 2008/0133203 A1    Jun. 5, 2008

(30) Foreign Application Priority Data
Nov. 30, 2006    (KR) .................. 10-2006-0119907

(51) Int. Cl.
*G06G 7/48*    (2006.01)
(52) U.S. Cl. ............................................. 703/4
(58) Field of Classification Search .................. 703/4
See application file for complete search history.

(56) References Cited

U.S. PATENT DOCUMENTS

| | | | | |
|---|---|---|---|---|
| 5,130,667 A | * | 7/1992 | Chang et al. | 330/253 |
| 5,301,084 A | * | 4/1994 | Miller | 361/56 |
| 5,672,893 A | | 9/1997 | Tihanyi | |
| 6,275,367 B1 | * | 8/2001 | Narita et al. | 361/91.5 |
| 6,750,517 B1 | * | 6/2004 | Ker et al. | 257/401 |
| 6,850,397 B2 | * | 2/2005 | Russ et al. | 361/91.8 |

FOREIGN PATENT DOCUMENTS

| | | |
|---|---|---|
| JP | 08-241995 | 9/1996 |
| KR | 10-2006-0038238 A | 5/2006 |
| KR | 10-2006-0067100 A | 6/2006 |

OTHER PUBLICATIONS

Weste et al., 1993. Addison-Wesley Publishing Company., "Principles of CMOS VLSI Design", p. 43-48.*

Liou, Juin J., et al., "Design and Modeling of On-Chip Electrostatic Discharge (ESD) Protection Structures", IEEE, May 2004, pp. 619-624, vol. 2, NIS, Serbia and Montenegro.

* cited by examiner

*Primary Examiner* — Jason Proctor
*Assistant Examiner* — Eunhee Kim
(74) *Attorney, Agent, or Firm* — Mills & Onello, LLP (57) ABSTRACT

A modeling circuit includes a field-effect transistor, a first current source, a first bipolar transistor, a second current source and a second bipolar transistor. The first bipolar transistor and the second bipolar transistor are parasitic bipolar transistors that are arranged symmetrically to each other. Therefore, the modeling circuit can be used in simulating the field effect transistors reflecting electrostatic-discharge characteristic regardless of the polarity of a source and a drain.

29 Claims, 8 Drawing Sheets

MODELING CIRCUIT OF A FIELD-EFFECT TRANSISTOR REFLECTING ELECTROSTATIC-DISCHARGE CHARACTERISTIC

CROSS-REFERENCE TO RELATED APPLICATIONS

This application claims priority under 35 USC §119 to Korean Patent Application No. 10-2006-0119907, filed on Nov. 30, 2006 in the Korean Intellectual Property Office (KIPO), the disclosure of which is incorporated herein in its entirety by reference.

BACKGROUND OF THE INVENTION

1. Field of the Invention

The present invention relates to modeling of a semiconductor integrated circuit, and more particularly to a modeling circuit of a field-effect transistor (FET) reflecting electrostatic-discharge characteristics.

2. Description of the Related Art

In the fabrication of semiconductor memory devices, designing an integrated circuit including function blocks is essential. In the process of designing an integrated circuit, advance verification of whether the integrated circuit is operating properly is needed. The Software Process Improvement and Capability dEtermination (SPICE) is widely used as a simulator that verifies an operation of an integrated circuit. The SPICE can perform modeling of various devices that are included in the integrated circuit using resistors, capacitors, and current sources reflecting electrical characteristic of the devices. In particular, a study on modeling of a Metal Oxide Semiconductor (MOS) transistor is continuously progressed because the MOS transistor is the most widely used device in integrated circuits.

As a design rule of a semiconductor device is ever-decreasing and, thus, a degree of integration of the semiconductor device is ever-increasing, a concern on electrostatic discharge (ESD) increases. The semiconductor device includes an ESD protection circuit used to prevent electric charge abnormally incoming from pads of the semiconductor device.

Figure 1:
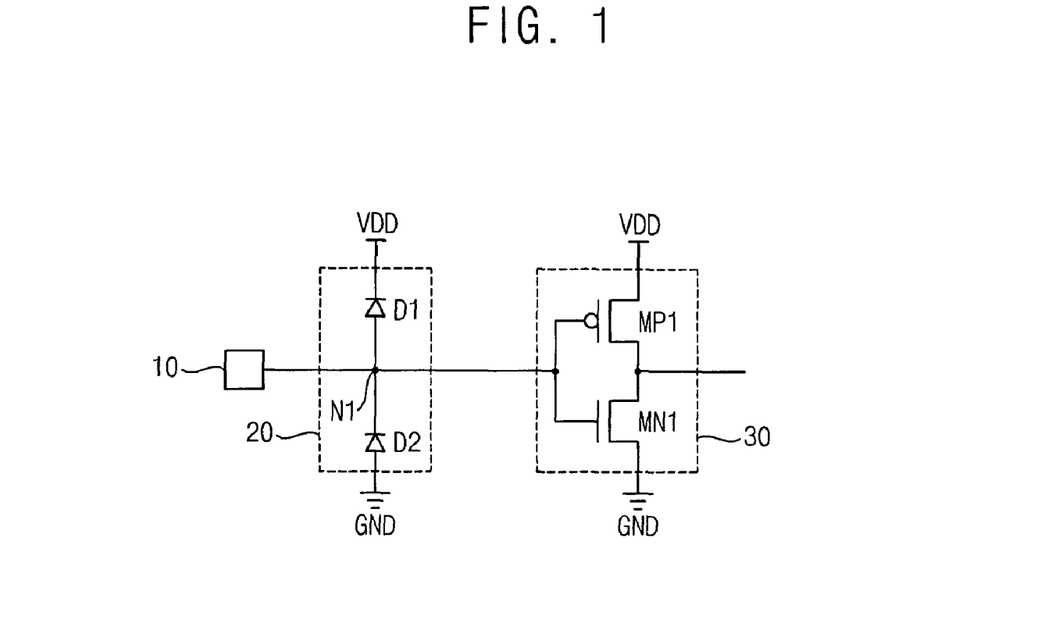
FIG. 1 is a circuit diagram illustrating an example of a semiconductor integrated circuit that includes an electrostatic discharge (ESD) protection circuit.

FIG. 1 is a circuit diagram illustrating an example of a semiconductor integrated circuit that includes an ESD protection circuit.

Referring to FIG. 1, the semiconductor integrated circuit includes an input pad 10, an ESD protection circuit 20, and an internal circuit 30. The ESD protection circuit 20 includes a first diode D1 and a second diode D2. The internal circuit 30 includes, for example, a buffer comprised of a PMOS transistor MP1 and an NMOS transistor MN1. The ESD protection circuit 20 limits a magnitude of a voltage of a node N1, to which the input pad 10 and the internal circuit 30 are coupled, within a predetermined range by providing a current path when an over-voltage due to an ESD event is applied to the input pad 10. Therefore, the internal circuit 30 is protected.

Figure 2:
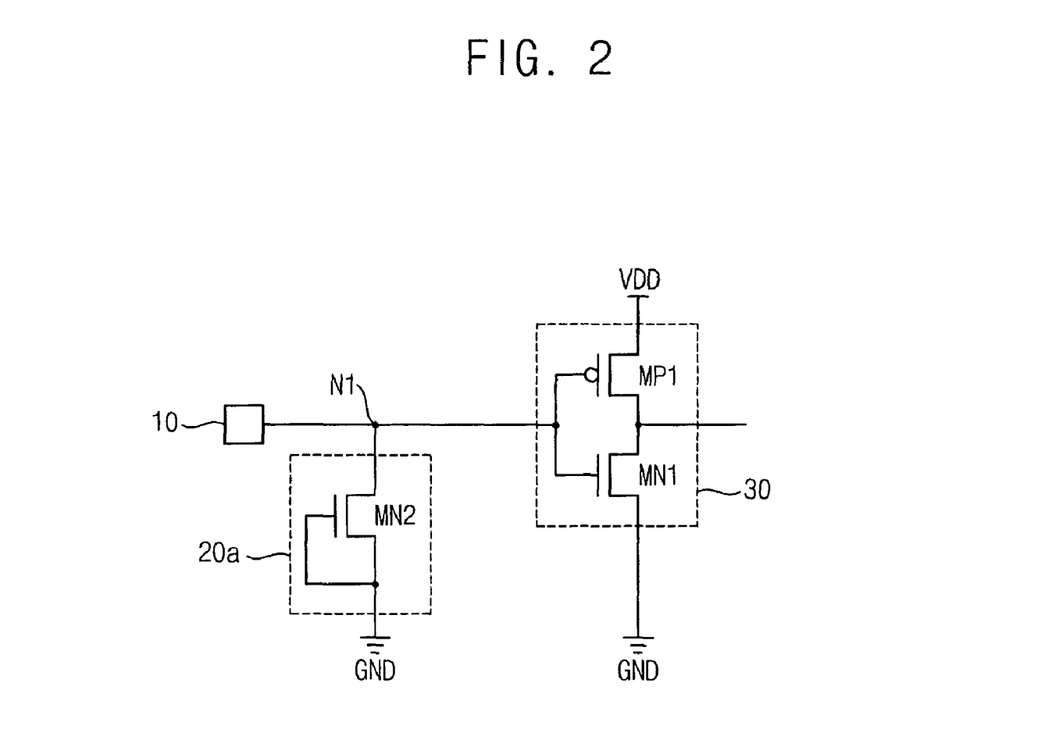
FIG. 2 is a circuit diagram illustrating another example of a semiconductor integrated circuit that includes an ESD protection circuit.

FIG. 2 is a circuit diagram illustrating another example of a semiconductor integrated circuit that includes an ESD protection circuit.

Referring to FIG. 2, the semiconductor integrated circuit includes an input pad 10, an ESD protection circuit 20a, and an internal circuit 30. The ESD protection circuit 20a includes a gate-coupled NMOS transistor (GCNMOS) MN2, of which a gate is coupled to the ground GND. The internal circuit 30 includes, for example, a buffer comprised of a PMOS transistor MP1 and an NMOS transistor MN1. The ESD protection circuit 20a limits a magnitude of a voltage of a node N1, to which the input pad 10 and the internal circuit 30 are coupled, within a predetermined range by providing a current path when an over-voltage due to an ESD event is applied to the input pad 10. Therefore, the internal circuit 30 is protected.

The gate-coupled NMOS transistor MN2 shown in FIG. 2 is also called a gate-grounded NMOS transistor (GGNMOS) because its gate is coupled to the ground GND.

Figure 3:
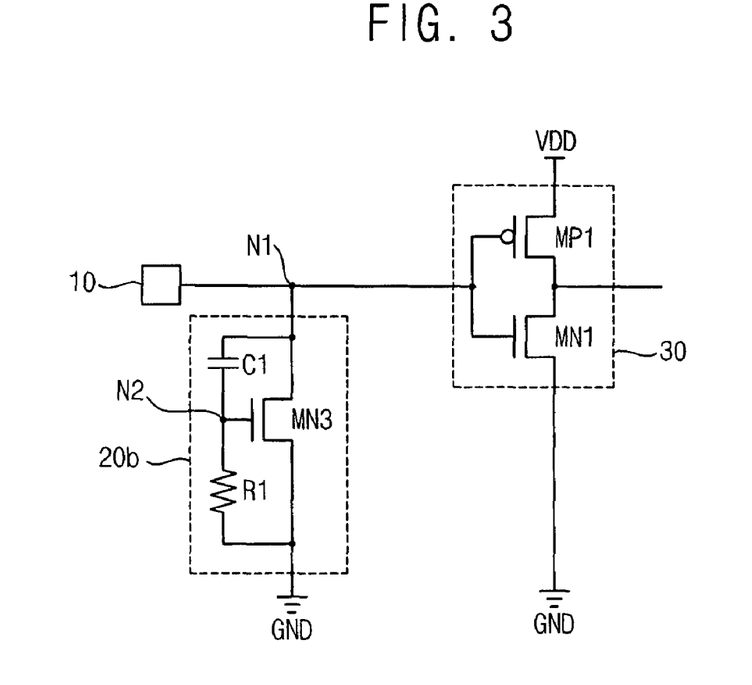
FIG. 3 is a circuit diagram illustrating still another example of a semiconductor integrated circuit that includes an ESD protection circuit.

FIG. 3 is a circuit diagram illustrating still another example of a semiconductor integrated circuit that includes an ESD protection circuit.

Referring to FIG. 3, the semiconductor integrated circuit includes an input pad 10, an ESD protection circuit 20b, and an internal circuit 30. The ESD protection circuit 20b includes a gate-coupled NMOS transistor MN3, which is coupled between a node N1 and the ground GND, a capacitor C1, and a resistor R1. The capacitor C1 is coupled between a gate and a drain of the gate-coupled NMOS transistor MN3, and the resistor R1 is coupled between the gate and a source of the gate-coupled NMOS transistor MN3. The internal circuit 30 includes, for example, a buffer comprised of a PMOS transistor MP1 and an NMOS transistor MN1. The ESD protection circuit 20b limits magnitude of a voltage of a node N1, to which the input pad 10 and the internal circuit 30 are coupled, within a predetermined range by providing a current path when a positive over-voltage due to an ESD event is applied to the input pad 10. Therefore, the internal circuit 30 is protected.

The gate-coupled NMOS transistor MN3 has the gate receiving a voltage higher than a voltage of the ground GND, unlike the gate-coupled NMOS transistor MN2 shown in FIG. 2. The node N2, i.e. the gate of the gate-coupled NMOS transistor MN3, receives the voltage that is determined by a resistor R1 and a capacitor C1.

Figure 4:
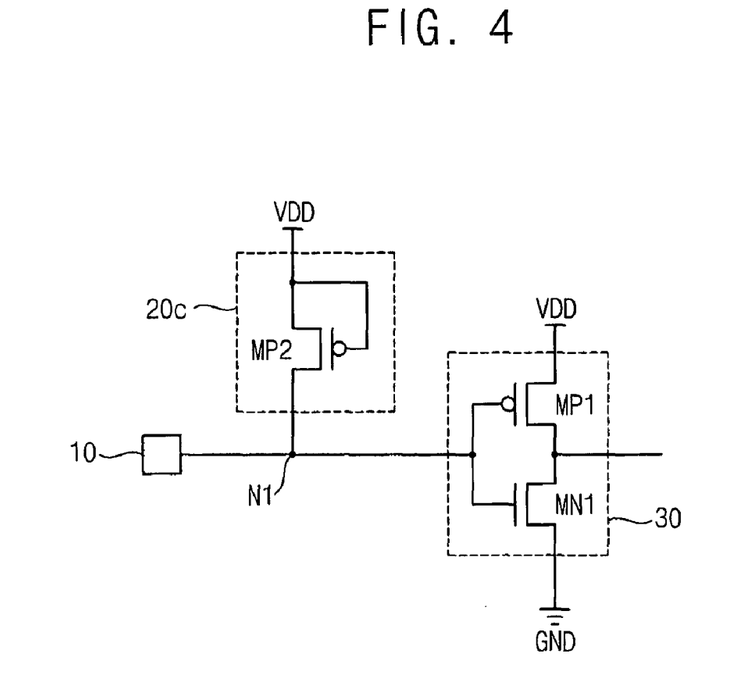
FIG. 4 is a circuit diagram illustrating still another example of a semiconductor integrated circuit that includes an ESD protection circuit.

FIG. 4 is a circuit diagram illustrating still another example of a semiconductor integrated circuit that includes an ESD protection circuit.

Referring to FIG. 4, the semiconductor integrated circuit includes an input pad 10, an ESD protection circuit 20c, and an internal circuit 30. The ESD protection circuit 20c includes a gate-coupled PMOS transistor (GCPMOS) MP2 of which a gate is coupled to a power supply voltage VDD. The internal circuit 30 includes a buffer comprised of a PMOS transistor MP1 and an NMOS transistor MN1. The ESD protection circuit 20c limits magnitude of a voltage of a node N1, to which the input pad and the internal circuit 30 are coupled, within a predetermined range by providing a current path when a negative over-voltage due to an ESD event is applied to the input pad 10. Therefore, the internal circuit 30 is protected.

Figure 5:
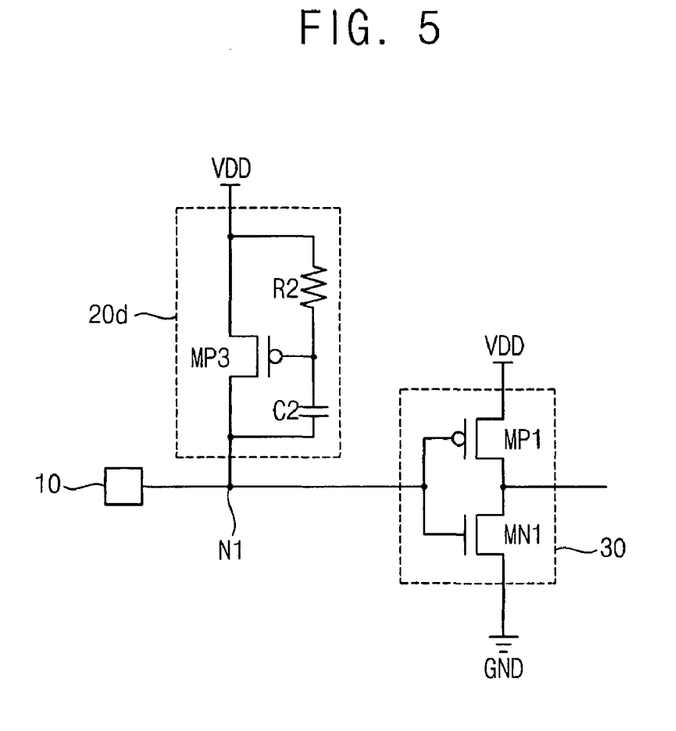
FIG. 5 is a circuit diagram illustrating still another example of a semiconductor integrated circuit that includes an ESD protection circuit.

FIG. 5 is a circuit diagram illustrating still another example of a semiconductor integrated circuit that includes an ESD protection circuit.

Referring to FIG. 5, the semiconductor integrated circuit includes an input pad 10, an ESD protection circuit 20d, and an internal circuit 30. The ESD protection circuit 20d includes a gate-coupled PMOS transistor MP3 that is coupled between a node N1 and a power supply voltage VDD, a capacitor C2, and a resistor R2. The capacitor C2 is coupled between a gate and a drain of the gate-coupled PMOS transistor MP3, and the resistor R2 is coupled between the gate and a source of the gate-coupled PMOS transistor MP3. The internal circuit 30 includes, for example, a buffer comprised of a PMOS transistor MP1 and an NMOS transistor MN1. The ESD protection circuit 20d limits magnitude of a voltage of a node N1, to which the input pad 10 and the internal circuit 30 are coupled, within a predetermined range by providing a current path when a negative over-voltage due to an ESD event is applied to the input pad 10. Therefore, the internal circuit 30 is protected.

The gate-coupled PMOS transistor MP3 has its gate receiving a voltage lower than the power supply voltage VDD, unlike the gate-coupled PMOS transistor MP2 shown in FIG. 4. The gate of the gate-coupled PMOS transistor MP3 receives the voltage that is determined by a resistor R2 and a capacitor C2.

Figure 6:
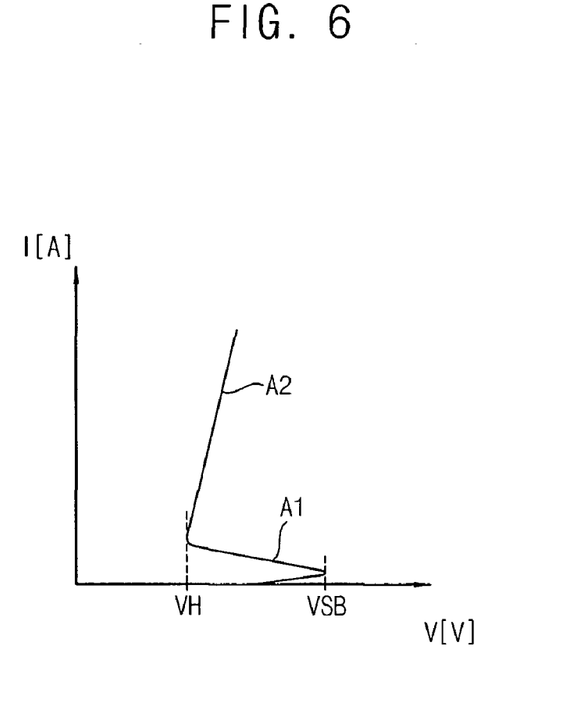
FIG. 6 is a graph illustrating electrical, properties of a gate-coupled NMOS transistor.

FIG. 6 is a graph illustrating electrical properties of a gate-coupled NMOS transistor. In FIG. 6, the horizontal axis denotes a drain voltage V of the gate-coupled NMOS transistor MN3 shown in FIG. 2, and the vertical axis denotes a drain current I. VSB denotes a snap-back voltage and VH denotes a holding voltage. A1 is a range in which the drain voltage decreases and the drain current increases slowly, and called a snap-back area. A2 is a range in which the drain voltage hardly changes and the drain current increases sharply.

Accordingly, as a semiconductor integrated circuit includes an ESD protection circuit, there is a need to consider ESD characteristic when modeling the MOS transistor included in the semiconductor integrated circuit.

Figure 7:
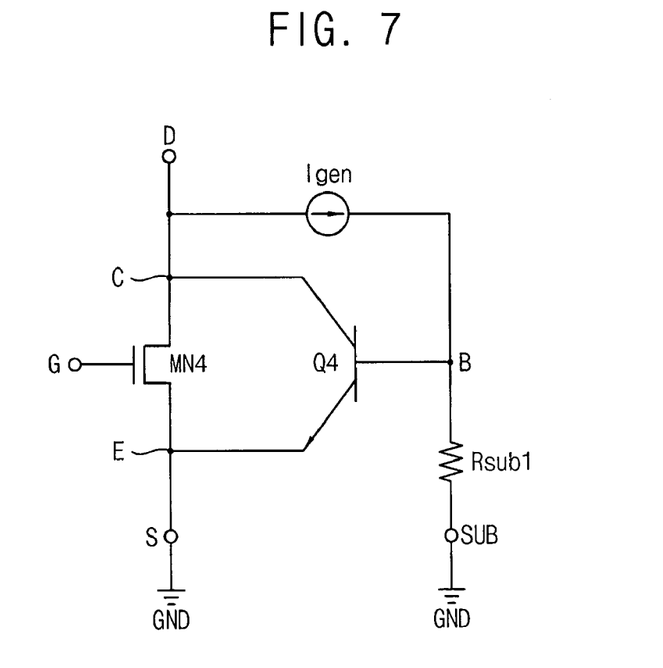
FIG. 7 is a circuit diagram illustrating a conventional modeling circuit of a gate-coupled NMOS transistor.

FIG. 7 is a circuit diagram illustrating a conventional modeling circuit of a gate-coupled NMOS transistor. The circuit of FIG. 7 is disclosed in PROC. 24$^{th}$ international conference on microelectronics, VOL. 2, pp. 619-624 in the title of 'Design and Modeling of On-Chip Electrostatic Discharge (ESD) Protection Structures'.

Referring to FIG. 7, the modeling circuit of a gate-coupled NMOS transistor 20 includes an NMOS transistor MN4, a substrate resistor Rsub1, a bipolar transistor Q4, and a current source Igen. The NMOS transistor MN4 has a drain D, a gate G, and a source S coupled to the ground GND. One end of the substrate resistor Rsub1 is coupled to a backside SUB of a semiconductor substrate. The backside SUB of the semiconductor substrate is coupled to the ground GND. The bipolar transistor Q4 has a collector C coupled to the drain D of the NMOS transistor MN4, an emitter E coupled to a source S of the NMOS transistor MN4, and a base B coupled to a second terminal of the substrate resistor Rsub1. The current source Igen is coupled between the drain D of the NMOS transistor MN4 and the base B of the bipolar transistor Q4. Electron-hole pairs (EHPs) are generated by a high voltage due to an ESD event that is applied to the drain D in a depletion layer formed at a junction of the drain area of the gate-coupled NMOS transistor and the backside SUB of the semiconductor substrate. A current based on the electron-hole pairs (EHPs) is denoted by Igen. The bipolar transistor Q4, which is connected in parallel with the NMOS transistor MN4, is operated using the current generated based on the electron-hole pairs (EHPs) as a base current. The substrate resistor Rsub1 represents a resistor between the base of the bipolar transistor Q4 and the backside of the semiconductor substrate SUB.

When simulating an integrated circuit included in a semiconductor device, it is required that the simulation be performed considering an ESD characteristic of not only the gate-coupled MOS transistor, but also all of the MOS transistors included in the integrated circuit.

Polarities of the drain and source can be changed according to voltages applied thereto. For example, a high voltage can be applied to a drain and a low voltage can be applied to a source. In contrast, a low voltage can be applied to a drain and a high voltage can be applied to a source.

SUMMARY OF THE INVENTION

In accordance with the present invention, provided is a modeling circuit of a field-effect transistor reflecting an ESD characteristic that can be used in circuit simulation regardless of polarities of a drain and a source.

In accordance with one aspect of the present invention, a modeling circuit includes a field-effect transistor, a first current source, a first bipolar transistor, a second current source and a second bipolar transistor. The first current source has a first terminal coupled to a drain of the field-effect transistor. The first bipolar transistor has a collector coupled to the drain of the field-effect transistor, an emitter coupled to a source of the field-effect transistor, and a base coupled to a second terminal of the first current source. The second current source has a first terminal coupled to the source of the field-effect transistor. The second bipolar transistor has a collector coupled to the source of the field-effect transistor, an emitter coupled to the drain of the field-effect transistor, and a base coupled to a second terminal of the second current source.

The modeling circuit can further include a first substrate resistor coupled between the base of the first bipolar transistor and a backside of a semiconductor substrate and a second substrate resistor coupled between the base of the second bipolar transistor and the backside of the semiconductor substrate.

The first bipolar transistor and the second bipolar transistor can be arranged symmetrically with respect to the field-effect transistor.

The second current source and the second bipolar transistor can be turned off when the first current source and the first bipolar transistor are turned on.

Each of the first current source and the second current source can correspond to a current that is generated by electron-hole pairs that exist in a depletion layer of a PN junction.

The first current source and the second current source can be arranged symmetrically with respect to the field-effect transistor.

The first substrate resistor and the second substrate resistor can be arranged symmetrically with respect to the field-effect transistor.

The field-effect transistor can be an NMOS transistor.

Each of the first bipolar transistor and the second bipolar transistor can be an NPN-type bipolar transistor.

A current of the first current source can flow from a drain of the NMOS transistor to the base of the first bipolar transistor.

A current of the first current source can be generated based on electron-hole pairs that exist in a drain-substrate junction area of the NMOS transistor.

A current of the second current source can flow from a source of the NMOS transistor to the base of the second bipolar transistor.

A current of the second current source can be generated based on electron-hole pairs that exist in a source-substrate junction area of the NMOS transistor.

A source of the NMOS transistor and a gate of the NMOS transistor can be coupled to a ground.

A source of the NMOS transistor can be coupled to a ground, and a first voltage that has a value between a source voltage and a drain voltage of the NMOS transistor can be applied to a gate of the NMOS transistor.

The first voltage can be determined by dividing the drain voltage of the NMOS transistor by a resistor and a capacitor.

The first current source and the first bipolar transistor can be turned on and the second current source and the second bipolar transistor can be turned off when a positive over-voltage is applied to a drain of the NMOS transistor.

The positive over-voltage can be generated based on a static electricity.

The field-effect transistor can be a PMOS transistor.

Each of the first bipolar transistor and the second bipolar transistor can be a PNP-type bipolar transistor.

A current of the first current source can flow from the base of the first bipolar transistor to a drain of the PMOS transistor.

A current of the first current source can be generated based on electron-hole pairs that exist in a drain-substrate junction area of the PMOS transistor.

A current of the second current source can flow from the base of the second bipolar transistor to a source of the PMOS transistor.

A current of the second current source can be generated based on electron-hole pairs that exist in a source-substrate junction area of the PMOS transistor.

A source of the PMOS transistor and a gate of the PMOS transistor can be coupled to a power supply voltage.

A source of the PMOS transistor can be coupled to a power supply voltage, and a first voltage that has a value between a source voltage and a drain voltage of the PMOS transistor can be applied to a gate of the PMOS transistor.

The first voltage can be determined by dividing the drain-source voltage of the PMOS transistor by a resistor and a capacitor.

The first current source and the first bipolar transistor can be turned on and the second current source and the second bipolar transistor can be turned off when a negative over-voltage is applied to a drain of the PMOS transistor.

The negative over-voltage can be generated based on a static electricity.

The field-effect transistor can be a gate-coupled MOS transistor.

Therefore, the modeling circuit of the field effect transistor according to aspects of the present invention can be applied to not only a gate-coupled field effect transistor, but also most of the field effect transistors in the integrated circuit because the modeling circuit can be used in simulating the field effect transistors reflecting ESD characteristic regardless of the polarity of a source and a drain.

DESCRIPTION OF THE EMBODIMENTS

Embodiments in accordance with the present invention will now be described more fully with reference to the accompanying drawings, in which embodiments in accordance with aspects of the invention are shown. This invention can, however, be embodied in many different forms and should not be construed as limited to the embodiments set forth herein. Like reference numerals refer to like elements throughout this application.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 8:
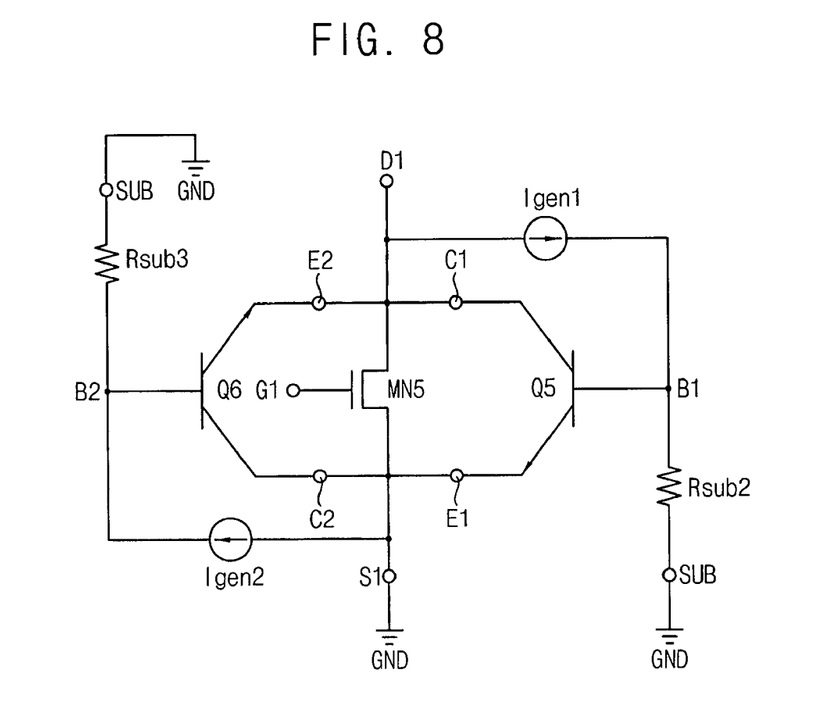
FIG. 8 is a circuit diagram illustrating an example embodiment of a modeling circuit of a gate-coupled NMOS transistor according to an aspect of the present invention.

FIG. 8 is a circuit diagram illustrating an example embodiment of a modeling circuit of a gate-coupled NMOS transistor according to an aspect of the present invention.

Referring to FIG. 8, the modeling circuit of a gate-coupled NMOS transistor includes an NMOS transistor MN5, a first substrate resistor Rsub2, a first bipolar transistor Q5, a first current source Igen1, a second substrate resistor Rsub3, a second bipolar transistor Q6, and a second current source Igen2.

The NMOS transistor MN5 has a drain D1, a gate G1, and a source S1 coupled to the ground GND. The first substrate resistor Rsub2 has a first terminal coupled to a backside SUB of a semiconductor substrate. The backside SUB of the semiconductor substrate is coupled to the ground GND. The first bipolar transistor Q5 has a first collector C1 coupled to the drain D1 of the NMOS transistor MN5, a first emitter E1 coupled to the source S1 of the NMOS transistor MN5, and a first base B1 coupled to a second terminal of the first substrate resistor Rsub2. The first current source Igen1 is coupled between the drain D1 of the NMOS transistor MN5 and the first base B1. The second substrate resistor Rsub3 has a first terminal coupled to the backside SUB of the semiconductor substrate. The second bipolar transistor Q6 has a second collector C2 coupled to the source S1 of the NMOS transistor MN5, a second emitter E2 coupled to the drain D1 of the NMOS transistor MN5, and a second base B2 coupled to a second terminal of the second substrate resistor Rsub3. The second current source Igen2 is coupled between the source S1 of the NMOS transistor MN5 and the second base B2.

Figure 9:
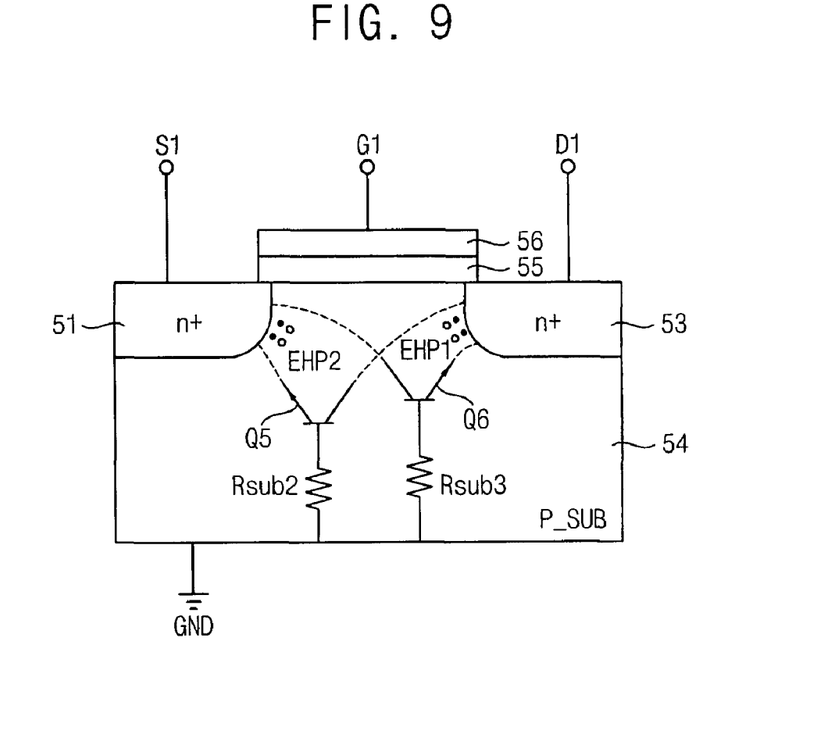
FIG. 9 is a cross-sectional diagram of an embodiment of a gate-coupled NMOS transistor illustrating a coupling of parasitic devices included in the modeling circuit of the gate-coupled NMOS transistor shown in FIG. 8.

FIG. 9 is a cross-sectional diagram of a gate-coupled NMOS transistor MN5 illustrating a coupling of parasitic devices included in the modeling circuit of the gate-coupled NMOS transistor shown in FIG. 8.

Referring to FIG. 9, the NMOS transistor MN5 includes a source area 51, a drain area 53, a gate oxide 55, and a gate area 56. The source area 51 and the drain area 53 are formed in an upper portion of a semiconductor substrate (P_SUB) 54. The source area 51 and the drain area 53 can have an N+ conductivity type, and the semiconductor substrate (P_SUB) 54 can have a P conductivity type. The backside of the semiconductor substrate (P_SUB) 54 is coupled to the ground GND. The semiconductor substrate (P_SUB) 54 includes the first substrate resistor Rsub2 and the second substrate resistor Rsub3.

In FIG. 9, electron-hole pairs EHP1 correspond to the first current source Igen1 shown in FIG. 8, and electron-hole pairs EHP2 correspond to the second current source Igen2. Further, the gate-coupled NMOS transistor includes the first bipolar transistor Q5 and second bipolar transistor Q6, which are both parasitic devices.

The source area 51 is coupled to a source terminal S1, the drain area 53 is coupled to a drain terminal D1, and the gate area 56 is coupled to a gate terminal G1. Hereinafter, the source area 51 and the source terminal SI are regarded as the same, for convenience of description, since the electric potential of the source area 51 and the source terminal S1 can be assumed to be identical. In the same way, the drain area 53 and the drain terminal D1 are regarded as the same, and the gate area 56 and the gate terminal G1 are regarded as the same.

Hereinafter, the operation of the modeling circuit of a gate-coupled NMOS transistor according to an example embodiment of the present invention will be described referring to FIG. 8 and FIG. 9.

Referring to FIG. 8 and FIG. 9, the first bipolar transistor Q5 is an NPN bipolar transistor, and includes the first base B1 composed of the semiconductor substrate P_SUB, the first collector C1 composed of the drain-area (D1) 53, and the first emitter area E1 composed of the source area (S1) 51. The first substrate resistor Rsub2 represents a resistor between the first base B1 and the backside of the semiconductor substrate P_SUB. Electron-hole pairs (EHPs) EHP1 are generated by a positive over-voltage due to an ESD event that is applied to the drain (D1) 53 in a depletion layer formed at a junction of the drain area (D1) 53 of the gate-coupled NMOS transistor MN5 and the semiconductor substrate P_SUB. Then, a base current of the first bipolar transistor Q5 flows based on EHP1. A current flowing through the first bipolar transistor Q5 flows from the drain area (D1) 53 to the source area (S1) 51 of the gate-coupled NMOS transistor MN5.

The second bipolar transistor Q6 includes the second base B2 composed of the semiconductor substrate P_SUB, the second collector C2 composed of the source area (S1) 51, and the second emitter area E2 composed of the drain area (D1) 53. The second substrate resistor Rsub3 represents a resistor between the second base B2 and the backside of the semiconductor substrate P_SUB. Electron-hole pairs (EHPs) EHP2 are generated by a positive over-voltage due to an ESD event that is applied to the source (S1) 51 in a depletion layer formed at a junction of the source area (S1) 51 of the NMOS transistor MN5 and the semiconductor substrate P_SUB. Then, a base current of the second bipolar transistor Q6 flows based on EHP2. A current flowing through the second bipolar transistor Q6 flows from the source area (S1) 51 to the drain area (D1) 53 of the gate-coupled NMOS transistor MN5.

In the modeling circuit of the gate-coupled NMOS transistor shown in FIG. 8, when the ground voltage GND is applied to the source S1 and a positive over-voltage is applied to the drain D1 of the NMOS transistor MN5, the first current source Igen1 is turned on and a current flows through the first bipolar transistor Q5. Then, the second current source Igen2 is turned off and the second bipolar transistor Q6 is turned off. However, when the ground voltage GND is applied to the drain D1 and a positive over-voltage is applied to the source S1 of the NMOS transistor MN5, the second current source Igen2 is turned on, and current flows through the second bipolar transistor Q6. Then, the first current source Igen1 is turned off and the first bipolar transistor Q5 is turned off.

Therefore, the modeling circuit of the gate-coupled NMOS transistor shown in FIG. 8 can be used in circuit simulation even when a drain terminal and a source terminal are interchanged, i.e., swapped one-for the other.

Figure 10:
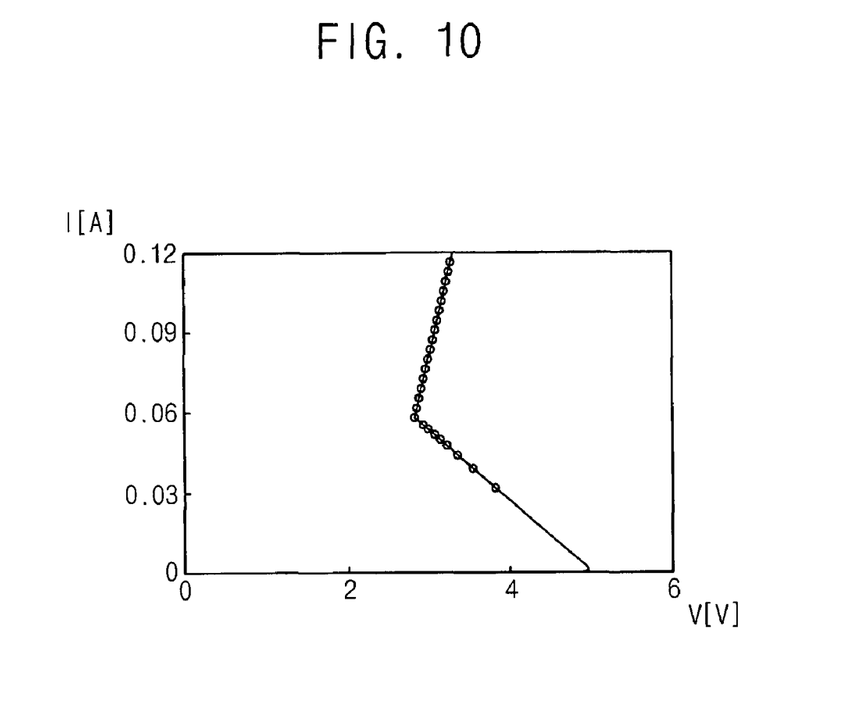
FIG. 10 is a graph illustrating a simulation result of the gate-coupled NMOS transistor using the modeling circuit shown in FIG. 8 comparing electrical properties of the gate-coupled NMOS transistor when a drain-source voltage has positive polarity and negative polarity.

FIG. 10 is a graph illustrating a simulation result of the gate-coupled NMOS is transistor using the modeling circuit shown in FIG. 8 to compare electrical properties of the gate-coupled NMOS transistor when a drain-source voltage has positive polarity-and negative polarity.

In the graph of FIG. 10, a curve drawn in a solid line represents a current flowing from the drain D1 to the source S1 when the drain-source voltage has positive polarity, i.e. positive value. A curve drawn in circles represents a current flowing from the source S1 to the drain D1 when the drain-source voltage has negative polarity, i.e. negative value.

Referring to FIG. 10, the gate-coupled NMOS transistor shows similar electrical characteristic whether the drain-source voltage is positive or negative. For example, when the modeling circuit of the gate-coupled NMOS transistor shown in FIG. 8 is used in circuit simulation, the simulation can be performed considering the ESD characteristic even when polarities of a drain terminal and a source terminal are interchanged, i.e., swapper one for the other.

Figure 11:
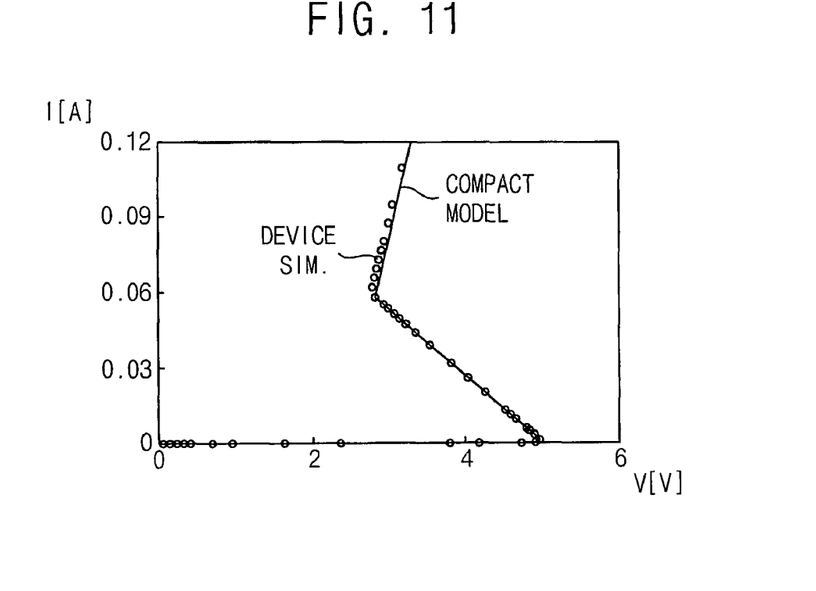
FIG. 11 is a graph illustrating a simulation result of the gate-coupled NMOS transistor using the modeling circuit shown in FIG. 8 and a simulation result of the gate-coupled NMOS transistor using a MEDICI device simulator.

FIG. 11 is a graph illustrating a simulation result of the gate-coupled NMOS transistor using the modeling circuit shown in FIG. 8 and a simulation result of the gate-coupled NMOS transistor, using MEDICI, which is a device simulator.

In the graph of FIG. 11, a curve drawn in a solid line represents a current flowing through the gate-coupled NMOS transistor when simulation is performed using the modeling circuit of the gate-coupled NMOS transistor shown in FIG. 8. Further, in FIG. 11, a curve drawn in circles represents a current flowing through the gate-coupled NMOS transistor when simulation is performed using MEDICI, which is a device simulator.

Referring to FIG. 11, the simulation result of the gate-coupled NMOS transistor using the modeling circuit shown in FIG. 8 and the simulation result of the gate-coupled NMOS transistor using MEDICI, which is a device simulator, are similar.

Figure 12:
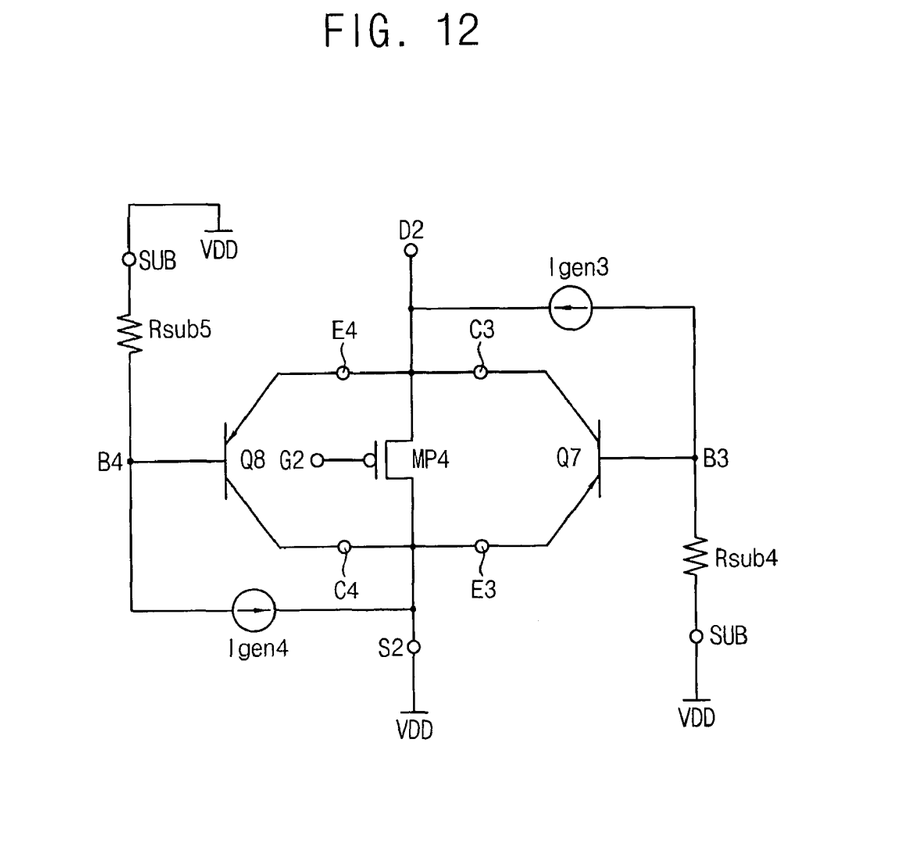
FIG. 12 is a circuit diagram illustrating an example embodiment of a modeling circuit of a gate-coupled PMOS transistor according to an aspect of the present invention.

FIG. 12 is a circuit diagram illustrating another embodiment of a modeling circuit of a gate-coupled PMOS transistor according to an aspect of the present invention.

Referring to FIG. 12, the modeling circuit of a gate-coupled PMOS transistor includes a PMOS transistor MP4, a first substrate resistor Rsub4, a first bipolar transistor Q7, a first current source Igen3, a second substrate resistor Rsub5, a second bipolar transistor Q8, and a second current source Igen4.

The PMOS transistor MP4 has a drain D2, a gate G2, and a source S2 coupled to the power supply voltage VDD. The first substrate resistor Rsub4 has a first terminal coupled to a backside SUB of a semiconductor substrate. The backside SUB of the semiconductor substrate is coupled to the power supply voltage VDD. The first bipolar transistor Q7 has a first collector C3 coupled to the drain D2 of the PMOS transistor MP4, a first emitter E3 coupled to the source S2 of the PMOS transistor MP4, and a first base B3 coupled to a second terminal of the first substrate resistor Rsub4. The first current source Igen3 is coupled between the drain D2 of the PMOS transistor MP4 and the first base B3. The second substrate resistor Rsub5 has a first terminal coupled to the backside SUB of the semiconductor substrate. The second bipolar transistor Q8 has a second collector C4 coupled to the source S2 of the PMOS transistor MP4, a second emitter E4 coupled to the drain D2 of the PMOS transistor MP4, and a second base B4 coupled to a second terminal of the second substrate resistor Rsub5. The second current source Igen4 is coupled between the source S2 of the PMOS transistor MP4 and the second base B4. The current of the second current source Igen4 flows from the second base B4 to the source S2 of the PMOS transistor MP4.

Figure 13:
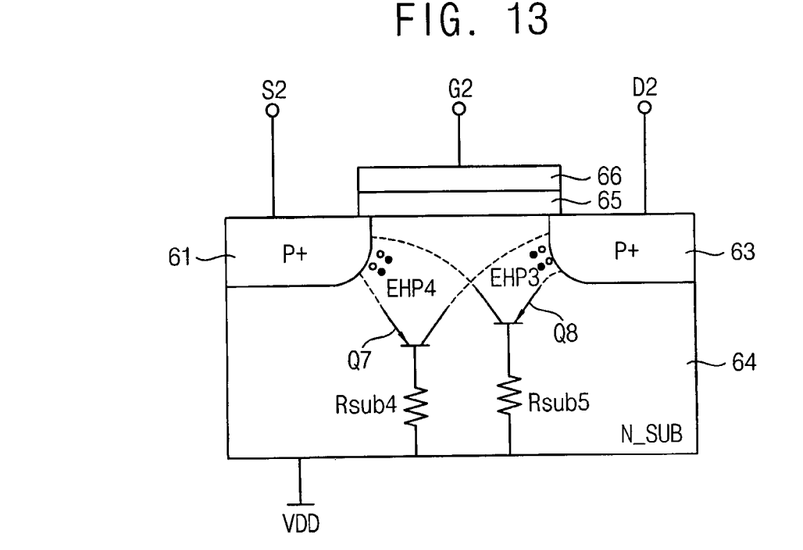
FIG. 13 is a cross-sectional diagram of an embodiment of a gate-coupled PMOS transistor illustrating a coupling of parasitic devices included in the modeling circuit of the gate-coupled PMOS transistor shown in FIG. 12.

FIG. 13 is a cross-sectional diagram of an embodiment of a gate-coupled PMOS transistor illustrating a coupling of parasitic devices included in the modeling circuit of the gate-coupled PMOS transistor shown in FIG. 12.

Referring to FIG. 13, the PMOS transistor MP4 includes a source area 61, a drain area 63, a gate oxide 65, and a gate area 66. The source area 61 and the drain area 63 are formed in an upper portion of and a semiconductor substrate (N_SUB) 64. The source area 61 and the drain area 63 can have a P+ conductivity type, and the semiconductor substrate (N_SUB) 64 can have a N conductivity type. The backside of the semiconductor substrate (N_SUB) 64 is coupled to the power supply voltage VDD. The semiconductor substrate (N_SUB) 64 includes the first substrate resistor Rsub4 and the second substrate resistor Rsub5.

In FIG. 13, electron-hole pairs EHP3 correspond to the first current source Igen3 shown in FIG. 12, and electron-hole pairs EHP4 correspond to the second current source Igen4. Further, the gate-coupled PMOS transistor includes the first bipolar transistor Q7 and the second bipolar transistor Q8, which are both parasitic devices.

The source area 61 is coupled to a source terminal S2, the drain area 63 is coupled to a drain terminal D2, and the gate area 66 is coupled to a gate terminal G2. Hereinafter, the source area 61 and the source terminal S2 are regarded as the same, for convenience of description, since the electric potential of the source area 61 and the source terminal S2 can be assumed to be identical. In the same way, the drain area 63 and the drain terminal D2 are regarded as the same, and the gate area 66 and the gate terminal G2 are regarded as the same.

Hereinafter, the operation of the modeling circuit of a gate-coupled PMOS transistor according to an example embodiment of the present invention will be described referring to FIG. 12 and FIG. 13.

Referring to FIG. 12 and FIG. 13, the first bipolar transistor Q7 is a PNP bipolar transistor, and includes the first base B3 composed of the semiconductor substrate N_SUB, the first collector C3 composed of the drain area (D2) 63, and the first emitter area E3 composed of the source area (S2) 61. The first substrate resistor Rsub4 represents a resistor between the first base B3 and the backside of the semiconductor substrate N_SUB. Electron-hole pairs (EHPs) EHP3 are generated by a negative over-voltage due to an ESD event that is applied to the drain (D2) 63 in a depletion layer formed at a junction of the drain area (D2) 63 of the gate-coupled PMOS transistor MP4 and the semiconductor substrate N_SUB. Then, a base current of the first bipolar transistor Q7 flows based on EHP3. A current flowing through the first bipolar transistor Q7 flows from the source area (S2) 61 to the drain area (D2) 63 of the gate-coupled PMOS transistor MP4.

The second bipolar transistor Q8 includes the second base B4 composed of the semiconductor substrate N_SUB, the second emitter area E4 composed of the drain area (D2) 63, and the second collector C4 composed of the source area (S2) 61. The second substrate resistor Rsub5 represents a resistor between the second base B4 and the backside of the semiconductor substrate N_SUB. Electron-hole pairs (EHPs) EHP4 are generated by a negative over-voltage due to an ESD event that is applied to the source (S2) 61 in a depletion layer formed at a junction of the source area (S2) 61 of the PMOS transistor MP4 and the semiconductor substrate N_SUB. Then, a base current of the second bipolar transistor Q8 flows based on EHP4. A current flowing through the second bipolar transistor Q8 flows from the drain area (D2) 63 to the source area (S2) 61 of the gate-coupled PMOS transistor MP4.

In the modeling circuit of the gate-coupled PMOS transistor shown in FIG. 12, when the power supply voltage VDD is applied to the source S2 and a negative over-voltage is applied to the drain D2 of the PMOS transistor MP4, the first current source Igen3 is turned on and a current flows through the first bipolar transistor Q7. Then, the second current source Igen4 is turned off and the second bipolar transistor Q8 is turned off. However, when the power supply voltage VDD is applied to the drain D2 and a negative over-voltage is applied to the source S2 of the PMOS transistor MP4, the second current source Igen4 is turned on, and current flows through the second bipolar transistor Q8. Then, the first current source Igen3 is turned off and the first bipolar transistor Q7 is turned off.

Therefore, the modeling circuit of the gate-coupled PMOS transistor shown in FIG. 12 can be used in circuit simulation even when a drain terminal and a source terminal are changed each other.

Figure 14:
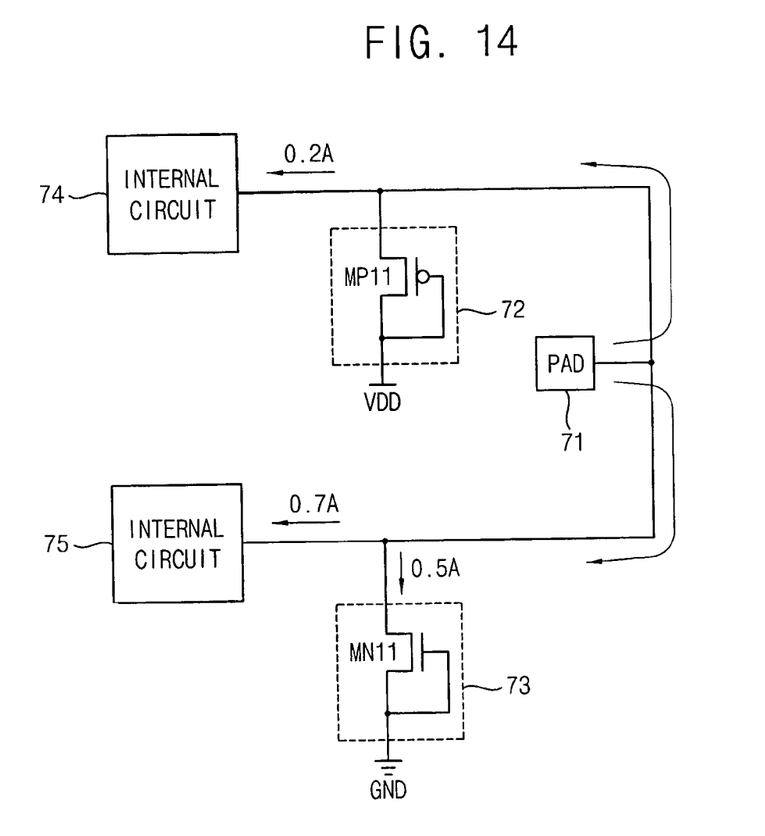
FIG. 14 is a circuit diagram illustrating currents flowing through internal circuits of a semiconductor integrated circuit.
Figure 15:
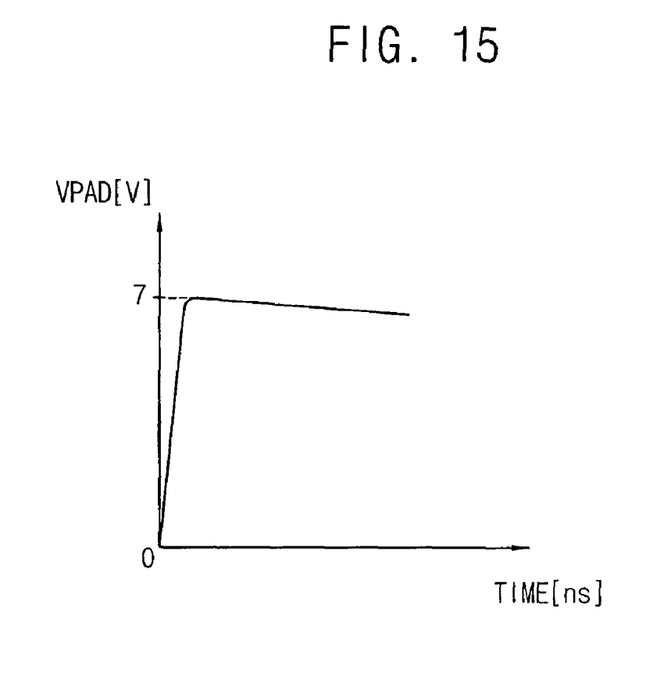
FIG. 15 is a waveform diagram illustrating a voltage measured at the pad of the semiconductor integrated circuit in FIG. 14.

FIG. 14 is a circuit diagram illustrating currents flowing through internal circuits of a semiconductor integrated circuit. FIG. 15 is a waveform diagram illustrating a voltage measured at the pad of the semiconductor integrated circuit in FIG. 14, and FIG. 16 is a waveform diagram illustrating a current that flows from the pad to the internal circuits of the semiconductor integrated circuit in FIG. 14.

The semiconductor integrated circuit shown in FIG. 14 includes a pad 71, a first ESD protection circuit 72 composed of a gate-coupled PMOS transistor. MP11, a second ESD protection circuit 73 composed of a gate-coupled NMOS transistor MN11, a first internal circuit 74, and a second internal circuit 75.

Figure 16:
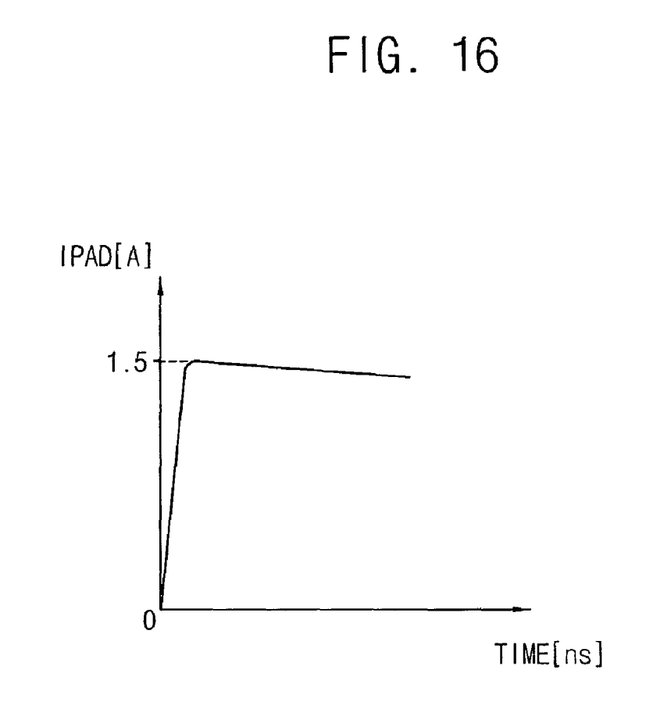
FIG. 16 is a waveform diagram illustrating a current that flows from the pad to the internal circuits of the semiconductor integrated circuit in FIG. 14.

Referring to FIGS. 14, 15 and 16, a voltage VPAD of the input pad 71 decreases gradually starting from a maximum value of 7V when a positive over-voltage of thousands of volts is applied to the input pad 71 as shown in FIG. 15. Further, the current flowing through the input pad 71 to the internal circuits 74 and 75 decreases gradually starting from a maximum value of 1.5 A. Referring to FIG. 14, 0.2 A flows from the input pad 71 to the first internal circuit 74, 0.7 A flows from the input pad 71 to the second internal circuit 75, and 0.5 A flows through the second ESD protection circuit 73. However, a current hardly flows through the first ESD protection circuit 72.

Accordingly, the modeling circuit of the field effect transistor shown in FIG. 8 and FIG. 12 can be used in circuit simulation considering ESD characteristic.

As described above, the modeling circuit of the field effect transistor according to aspects the present invention includes parasitic bipolar transistors that are symmetrically arranged. The modeling circuit of the field effect transistor according to the present invention can be applied to not only a gate-coupled field effect transistor but also most of the field effect transistors in the integrated circuit because the modeling circuit can be used in simulating the field effect transistors reflecting ESD characteristic regardless of the polarity of a source and a drain. Further, if the modeling circuit of the field effect transistor according to aspects of the present invention is used, a time needed to analyze property of the gate-coupled MOS transistor using a device simulator can be decreased.

While the example embodiments in accordance with aspects of the present invention and its advantages have been described in detail, it should be understood that various changes, substitutions and alterations can be made herein without departing from the scope of the invention as defined by appended claims. The invention, therefore, is defined by the scope of the claims and is not limited to the example embodiments provided herein.

What is claimed is:
1. A modeling circuit, comprising:
 a field-effect transistor;
 a first current source having a first terminal coupled to a drain of the field-effect transistor;
 a first bipolar transistor having a collector coupled to the drain of the field-effect transistor, an emitter coupled to a source of the field-effect transistor, and a base coupled to a second terminal of the first current source;
 a second current source having a first terminal coupled to the source of the field-effect transistor;
 a second bipolar transistor having a collector coupled to the source of the field-effect transistor, an emitter coupled to the drain of the field-effect transistor, and a base coupled to a second terminal of the second current source;
 a first substrate resistor coupled between the base of the first bipolar transistor and a backside of a semiconductor substrate; and
 a second substrate resistor coupled between the base of the second bipolar transistor and the backside of the semiconductor substrate.

2. The modeling circuit of claim 1, wherein the first bipolar transistor and the second bipolar transistor are arranged symmetrically with respect to the field-effect transistor.

3. The modeling circuit of claim 1, wherein the second current source and the second bipolar transistor are turned off when the first current source and the first bipolar transistor are turned on.

4. The modeling circuit of claim 1, wherein each of the first current source and the second current source corresponds to a current that is generated by electron-hole pairs that exist in a depletion layer of a PN junction.

5. The modeling circuit of claim 1, wherein the first current source and the second current source are arranged symmetrically with respect to the field-effect transistor.

6. The modeling circuit of claim 1, wherein the first substrate resistor and the second substrate resistor are arranged symmetrically with respect to the field-effect transistor.

7. The modeling circuit of claim 1, wherein the field-effect transistor is an NMOS transistor.

8. The modeling circuit of claim 7, wherein each of the first bipolar transistor and the second bipolar transistor is an NPN-type bipolar transistor.

9. The modeling circuit of claim 7, wherein a current of the first current source flows from a drain of the NMOS transistor to the base of the first bipolar transistor.

10. The modeling circuit of claim 9, wherein a current of the first current source is generated based on electron-hole pairs that exist in a drain-substrate junction area of the NMOS transistor.

11. The modeling circuit of claim 8, wherein a current of the second current source flows from a source of the NMOS transistor to the base of the second bipolar transistor.

12. The modeling circuit of claim 11, wherein a current of the second current source is generated based on electron-hole pairs that exist in a source-substrate junction area of the NMOS transistor.

13. The modeling circuit of claim 8, wherein a source of the NMOS transistor and a gate of the NMOS transistor are coupled to a ground.

14. The modeling circuit of claim 8, wherein a source of the NMOS transistor is coupled to a ground, and a first voltage that has a value between a source voltage and a drain voltage of the NMOS transistor is applied to a gate of the NMOS transistor.

15. The modeling circuit of claim 14, wherein the first voltage is determined by dividing the drain voltage of the NMOS transistor by a resistor and a capacitor.

16. The modeling circuit of claim 13, wherein the first current source and the first bipolar transistor are turned on and the second current source and the second bipolar transistor are turned off when a positive over-voltage is applied to a drain of the NMOS transistor.

17. The modeling circuit of claim 16, wherein the positive over-voltage is generated based on a static electricity.

18. The modeling circuit of claim 1, wherein the field-effect transistor is a PMOS transistor.

19. The modeling circuit of claim 18, wherein each of the first bipolar transistor and the second bipolar transistor is a PNP-type bipolar transistor.

20. The modeling circuit of claim 19, wherein a current of the first current source flows from the base of the first bipolar transistor to a drain of the PMOS transistor.

21. The modeling circuit of claim 20, wherein a current of the first current source is generated based on electron-hole pairs that exist in a drain-substrate junction area of the PMOS transistor.

22. The modeling circuit of claim 19, wherein a current of the second current source flows from the base of the second bipolar transistor to a source of the PMOS transistor.

23. The modeling circuit of claim 22, wherein a current of the second current source is generated based on electron-hole pairs that exist in a source-substrate junction area of the PMOS transistor.

24. The modeling circuit of claim 18, wherein a source of the PMOS transistor and a gate of the PMOS transistor are coupled to a power supply voltage.

25. The modeling circuit of claim 18, wherein a source of the PMOS transistor is coupled to a power supply voltage, and a first voltage that has a value between a source voltage and a drain voltage of the PMOS transistor is applied to a gate of the PMOS transistor.

26. The modeling circuit of claim 25, wherein the first voltage is determined by dividing the drain-source voltage of the PMOS transistor by a resistor and a capacitor.

27. The modeling circuit of claim 24, wherein the first current source and the first bipolar transistor are turned on and the second current source and the second bipolar transistor are turned off when a negative over-voltage is applied to a drain of the PMOS transistor.

28. The modeling circuit of claim 27, wherein the negative over-voltage is generated based on a static electricity.

29. The modeling circuit of claim 1, wherein the field-effect transistor is a gate-coupled MOS transistor.

* * * * *